(12) United States Patent
Hochberg et al.

(10) Patent No.: US 8,410,420 B1
(45) Date of Patent: Apr. 2, 2013

(54) SEMICONDUCTOR TRAVELLING-WAVE EVANESCENT WAVEGUIDE PHOTODETECTOR

(75) Inventors: Michael Hochberg, Seattle, WA (US); Thomas W. Baehr-Jones, Seattle, WA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 478 days.

(21) Appl. No.: 12/690,030

(22) Filed: Jan. 19, 2010

Related U.S. Application Data

(60) Provisional application No. 61/145,417, filed on Jan. 16, 2009.

(51) Int. Cl.
*G01J 1/04* (2006.01)
*G01J 1/42* (2006.01)
*G01J 5/08* (2006.01)

(52) U.S. Cl. ............... 250/227.11; 250/214.1; 250/216; 385/30; 385/40

(58) Field of Classification Search ............... 250/214.1, 250/214 R, 216, 227.11; 430/321, 323; 385/12, 385/129, 40, 30; 27, 14, 49
See application file for complete search history.

(56) References Cited

U.S. PATENT DOCUMENTS

| | | | | |
|---|---|---|---|---|
| 7,528,403 | B1 * | 5/2009 | Borselli et al. | 257/25 |
| 8,148,794 | B2 * | 4/2012 | Masini et al. | 257/432 |
| 2007/0189688 | A1 * | 8/2007 | Dehlinger et al. | 385/129 |
| 2009/0016399 | A1 * | 1/2009 | Bowers | 372/50.21 |
| 2009/0184383 | A1 * | 7/2009 | Seeds et al. | 257/432 |

FOREIGN PATENT DOCUMENTS

WO    WO 2007113502 A1 * 10/2007

OTHER PUBLICATIONS

Park et al.,"A hybrid AlGaInAs-Silicon evanescent waveguide photodetector", Optics Express, vol. 15, No. 10, pp. 6044-6052, May 14, 2007.*

Wang et al. ,"Evanescent-Coupled Ge p-i-n photodetectors on Si-Waveguide With SEG-Ge and Comparative Study of Lateral and Vertical p-i-n Configurations", IEEE Electron Device Letters, vol. 29, No. 5, pp. 445-448, May 5, 2008.*

* cited by examiner

*Primary Examiner* — Francis M Legasse, Jr.
(74) *Attorney, Agent, or Firm* — Perkins Coie LLP

(57) ABSTRACT

An optoelectronic structure includes a waveguide region, a detector region that is weakly evanescently coupled to the waveguide region, and a dielectric layer interposed between the waveguide region and the detector region and configured to provide the weak evanescent coupling.

17 Claims, 3 Drawing Sheets

SEMICONDUCTOR TRAVELLING-WAVE EVANESCENT WAVEGUIDE PHOTODETECTOR

CROSS-REFERENCE TO RELATED APPLICATIONS

This application claims priority to and the benefit of co-pending U.S. provisional patent application Ser. No. 61/145,417, filed Jan. 16, 2009, which application is hereby incorporated by reference herein in its entirety.

TECHNICAL FIELD

The present invention is directed generally to semiconductor-based optoelectronic devices, and in particular, but not necessarily exclusively, to a photodetector.

BACKGROUND

Photodetectors are a fundamental component of optoelectronic systems, converting an intensity modulated mode of optical radiation into a voltage signal. A characteristic of many current high-speed photodetectors is that they have a relatively low saturation power, often on the order of 5 mW or less. This is a significant limitation, not only because optical powers higher than this can't be used, but also because at even lower optical powers the response becomes nonlinear. This interferes in many important aspects of RF system performance, such as the spur-free dynamic range and the output OIP2 and OIP3 intercept points.

A natural way to increase the saturation power of a photodetector would be to make the active area larger. Indeed, this is the mechanism by which high power photodetectors are usually built. However, this creates significant limitations on device response time, due to larger areas that carriers must traverse to reach the output electrodes.

Waveguide integrated photodetectors for near-infrared radiation (near 1550 nm) typically use an evanescently coupled semiconductor material that has a bandgap past 1550 um, such as Germanium or a III-V semiconductor, often with lengths on the order of 20-30 um. However, the limited area of these photodetectors suggests that saturation is likely no better than what is found in conventional photodetectors.

BRIEF DESCRIPTION OF THE DRAWINGS

Non-limiting and non-exhaustive embodiments of the present invention are described with reference to the following drawings, in which.

DETAILED DESCRIPTION

Figure 1:
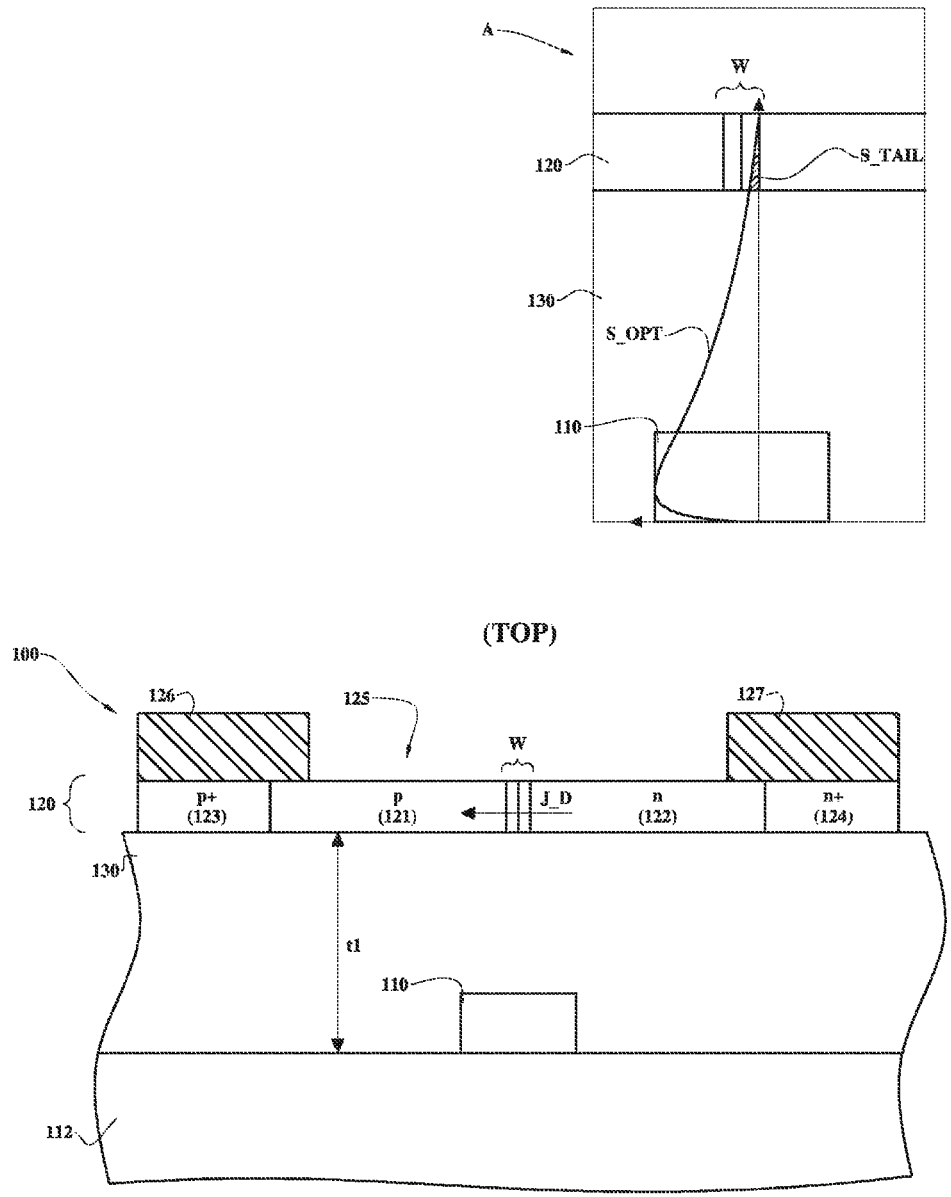
FIG. 1 is a cross-sectional side view of an embodiment of an optoelectronic structure.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Briefly stated, the invention is related to an optoelectronic structure. The optoelectronic structure includes a waveguide region, a detector region that is weakly evanescently coupled to the waveguide region, and a dielectric layer interposed between the waveguide region and the detector region and configured to provide the weak evanescent coupling.

FIG. 1 is a cross-sectional side view of an embodiment of an optoelectronic structure 100. The optoelectronic structure 100 includes a waveguide region 110 that is arranged to guide an optical mode of an optical signal S_OPT (see Inset A), a detector region 120 that is weakly evanescently coupled to the waveguide region 110 and arranged to detect the optical signal S_OPT via the weak evanescent coupling, and a dielectric region 130 that is configured to provide the weak evanescent coupling.

The waveguide region 110 is carried by a substrate 112. For example, the substrate 112 can include a silicon-on-insulator (SOI) substrate and the waveguide region 110 can be formed on the buried oxide (BOX) layer of the SOI substrate.

Accordingly, if the waveguide region 110 is silicon-based, the wavelength of the optical signal S_OPT may be in the infrared frequency regime. In other embodiments, the waveguide region 110 may be formed in a different semiconductor material and the optical signal S_OPT may thus have a different wavelength. For example, if the waveguide region 110 is formed in a different semiconductor material, the optical signal S_OPT may have a wavelength that is less than the bandgap of that different semiconductor material.

The detector region 120 includes a p-type area 121, an n-type area 122, a p+ type area 123, an n+ type area 124, and electrodes 126 and 127 coupled, respectively, to p+ type area 123 and n+ type area 124. P-type area 121 and n-type area 122 form a PN junction 125 having a depletion region W that is configured to provide a detection current J_D. To provide optical detection, the PN junction 125 is arranged to receive, via the weak evanescent coupling, a portion of the optical energy of the optical signal S_OPT (as used herein, the term optical energy can refer to electromagnetic radiation having wavelengths in the range of about 200 nm to 200 um, in free space). More specifically, the PN junction 125 provides the detection current J_D based on the energy of the optical signal S_OPT. An output RF signal can in turn be read differentially across the electrodes 126 and 127 based on the detection current J_D. In some embodiments, the depletion region may have a width that is outside of the submicron regime to increase the magnitude of the detection current J_D (described in more detail below).

In one embodiment the detector region 120 may be manufactured in Germanium and implanted to form the various areas 121-124. Alternatively, the detector region 120 may be made from other materials such as Group III-V or Group II-VI semiconductor materials and/or may be implanted differently.

The dielectric layer 130 has a thickness t1 and includes one or more microelectronic layers for separating the waveguide region 110 from the detector region 120 and generally confining the optical signal S_OPT to the waveguide. The dielectric layer 130 is an optically-absorbing material that is configured to weaken the evanescent coupling between the waveguide region 110 and the detector region 120. For example, the dielectric layer 130 can be a conformal silicon oxide-based film (described further with reference to FIG. 3). The dielectric layer 130 dramatically increases the attenuation length of the optical mode as it travels through the photodetector region 130 (see Inset A). Consequently, and compared to conventional waveguide photodetectors, only a small amount of power is absorbed by the detector region 120 per unit length. This means, for example, that the waveguide region 110 can carry optical radiation having an average power that is greater than 5 mW without power saturation of the detector region 120 (because only a fraction of the optical radiation will be transferred from the waveguide region 110 to the detector region 120). For example, only a tail portion S_TAIL (see Inset A) of the optical mode is transferred to the detector region 120.

The amount of optical absorption per unit length can be tuned by increasing the distance of the optically absorbing material from the optical mode. In one embodiment, this is achieved by having the thickness t1 of the dielectric layer 130 be in the range of 1/10 wavelength to 10 wavelengths (at the wavelength being detected). Because the thickness t1 can scale with wavelength, the dielectric layer 130 may be greater than 1 cm in some embodiments. In an additional or alternative embodiment, a weak evanescent coupling can be achieved by proper choice of material for the dielectric layer 130. For example, the dielectric layer 130 can be treated (e.g., doped and/or annealed) or be a structure of stacked layers to tailor the dielectric constant.

In some embodiments, the optoelectronic structure 100 will no longer be far sub-wavelength in geometry. For example, at 20 GHz, the RF wavelength in free space is 1.5 cm, and on chip the wavelength will be shorter. As a result, travelling wave design can be employed (described further with reference to FIG. 2). The electrodes 126 and 127, for example, will behave as a TEM waveguide for RF radiation, and the RF mode will be excited in a distributed fashion. This requires phase velocity matching between the RF mode and the optical mode. For example, a high dielectric material near the RF mode can be employed. Additionally or alternatively, lumped delay elements can provide phase velocity matching (though this might make the optoelectronic structure 100 less broad band).

In some embodiments, a conventional, reverse DC bias can be applied across the electrodes 126 and 127. However, if the overall size of the depletion region W is large, the dark current of the PN junction 125 might be large due to the larger area. To mitigate this, the PN junction 125 may not be reverse biased in certain embodiments. In such embodiments, the detection current J_D will nevertheless flow due to the intrinsic field of the PN junction 125 (the same effect used in photovoltaic cells). Although this might limit conversion efficiency, it dramatically reduces the dark current and thus decreases noise.

Figure 2:
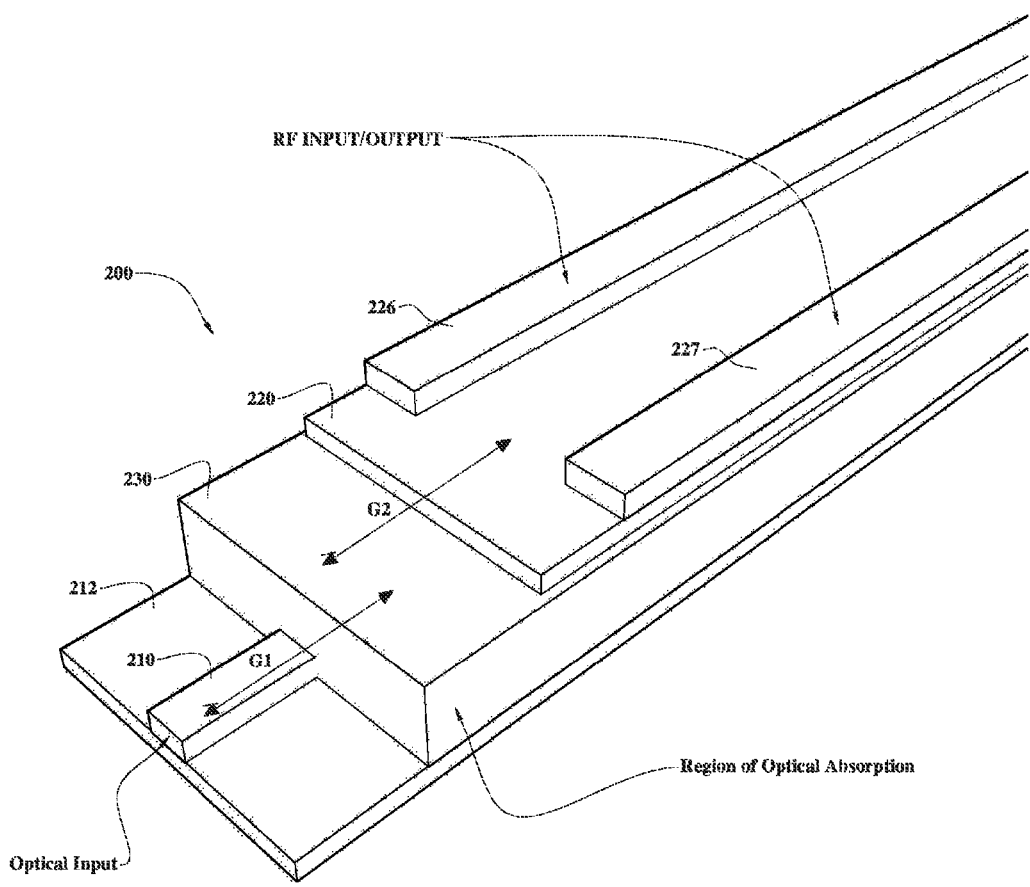
FIG. 2 is a partially cut-away, isometric view of an embodiment of an optoelectronic device arranged in a travelling wave configuration.

FIG. 2 is a partially cut-away, isometric view of an embodiment of an optoelectronic device 200 arranged in a travelling wave configuration. This embodiment generally shows one device configuration for the optoelectronic structure 100, for example. A variety of other device configurations, however, are possible.

As shown, the optoelectronic device 200 includes waveguide 210, substrate 212, photodetector 220, electrodes 226 and 227, and dielectric layer 230. The waveguide 210 includes an axis G1 that is arranged to guide the optical signal S_OPT (See Inset A of FIG. 1). The photodetector 220 includes an axis G2 that is aligned with the axis G1 of the waveguide 210 and arranged to provide an RF signal such that the RF signal is phase matched with the optical signal. In particular, the electrodes 226 and 227 are aligned with the waveguide 210. As discussed above, a variety of techniques may be employed for phase velocity matching an optical mode of the optical signal with, for example, the TEM modes of the RF signal.

Figure 3:
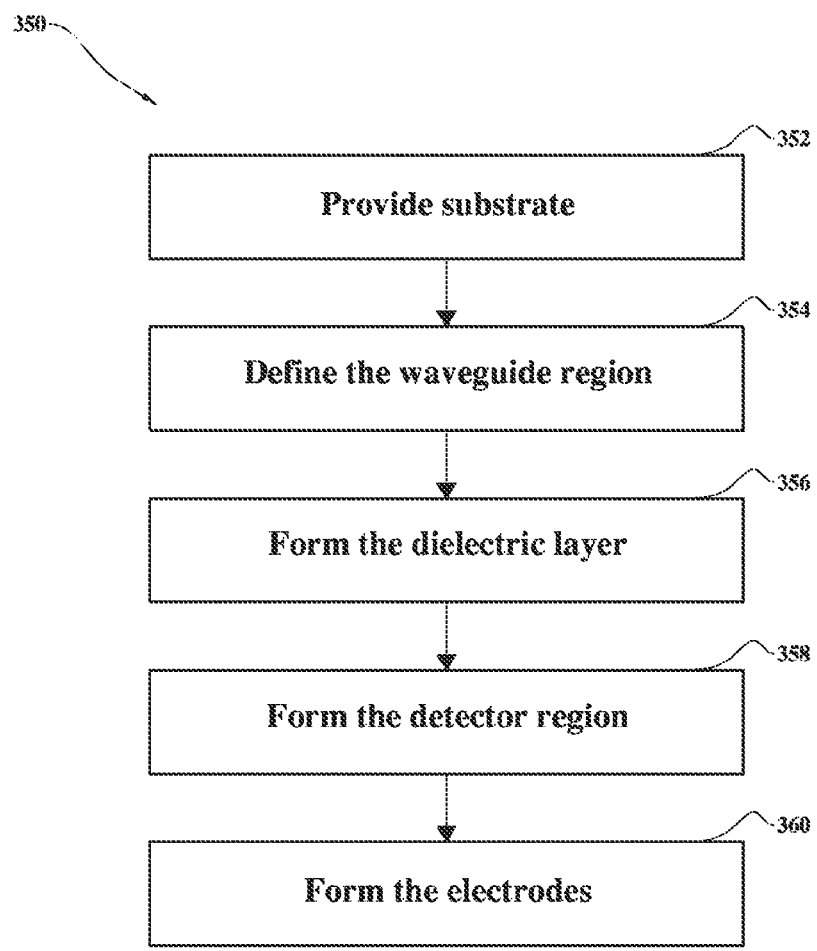
FIG. 3 is a process flow diagram generally showing an embodiment of a process for manufacturing optoelectronic structures and devices.

FIG. 3 is a processing flow diagram generally showing one embodiment of process 350 for manufacturing the optoelectronic structure 100. Process 350 begins at block 352, where a substrate is provided. In general, a substrate includes one or more semiconductor materials. As discussed above, embodiments of the optoelectronic structure may be manufactured in an SOI substrate. For example, the BOX layer may be a cladding layer and a waveguide region may be formed on the BOX layer. Alternatively, a different type of substrate may be employed. Also, in some embodiments, a substrate can be pre-processed prior to block 250. For example, a substrate may include pre-existing features for forming optical structures, electronic structures, opto-electronic structures, or other devices, such as diodes, transistors, capacitors, resistors, or the like.

Processing continues to block 354, where the substrate undergoes one or more patterning processes to define the waveguide region. In general, patterning processes can include any of a wide variety of combinations of photolithographic and etching processes. Photolithographic process can include, for example, single- or multi-step photolithographic techniques employing one or more photoresist masks, such as a photolithographic mask including UV or deep UV light sensitive materials and optionally back anti-reflective coatings (BARC). Etching processes can include, for example, one or more wet and/or dry etch techniques to etch through a photoresist mask and create patterned features in an underlying layer or substrate, including chemical and/or physical etching techniques, employing, for example, isotropic or anisotropic wet and/or dry etch chemistries, reactive ion etches, and/or plasma assisted etches. Also, in some embodiments, a photoresist mask layer can also be employed in combination with a "hard" mask, such as a silicon nitride hard mask.

Processing continues to block 356, where the dielectric layer is formed. A variety of deposition processes may be employed to form the dielectric layer, including chemical vapor deposition (CVD), physical vapor deposition (PVD), plasma enhanced CVD (PECVD), atomic layer deposition (ALD), or the like. Also, wafer bonding techniques may be employed. Further, a skilled artisan will appreciate that deposition process can be combined with a variety of other processes, such as chemical mechanical polishing (CMP) processes for planarizing the dielectric layer. In some embodiments, as discussed above, the dielectric layer may be a silicon-oxide based conformal film. Also, the dielectric layer may be implanted, annealed, or otherwise treated to tailor a dielectric constant.

Processing continues to block 358, where the detector region is formed. Similar to the dielectric layer, a variety of deposition processes may be employed to form the detector region. Also, one or more ion implantation processes can achieve a desired impurity concentration to form p, p+, n, and n+ areas in the detector region. Ion implantation process may employ various implantation energies to achieve a desired depth and concentration of implant species. Further, an ion implantation process can be employed in combination with any of a variety of thermal diffusion processes. A skilled artisan would also appreciate that patterning processes can be employed to define p, p+, n, and n+ areas.

Processing continues to block 360, where the electrodes are formed. One or more electrochemical plating processes and/or other metal deposition processes can be used to form the electrodes. Further, these processes may be combined with other processes for forming (e.g., silicide processes) for forming ohmic contacts with the detector region. A skilled artisan would also appreciate that patterning processes can be employed to define the electrodes.

Processing can continue after block 360, where additional features of the optoelectronic structure may be formed and/or other devices are formed. In one embodiment, for example, another embodiment, an optical device, such as a lumped delay element, may be formed adjacent to the detector region. A skilled artisan will appreciate that a wide variety of subsequent processes may be employed. Further, a skilled artisan will appreciate that a variety of other processes could be employed, including a variety of wet chemical and/or plasma processes for intermediary cleans and other processes.

The above specification, examples and data provide a description of the manufacture and use of the composition of the invention. The above description is not intended to be exhaustive and thus a variety of embodiments not described are intended to fall within the scope of the invention. For example, while the detector region 120 is shown as including a lateral PN junction, other embodiments of detector regions could include a vertically positioned PN junction or laterally or horizontally PIN junctions (having an intrinsic semiconductor area between p-type and n-type areas). Also, even though the above described two electrodes that are arranged to carry an RF signal, other embodiments may employ more or fewer electrodes for carrying an RF signal. Since many embodiments of the invention can be made without departing from the spirit and scope of the invention, the invention also resides in the claims hereinafter appended.

The invention claimed is:

1. An optoelectronic structure, comprising:
a waveguide region configured to guide an optical signal;
a detector region weakly evanescently coupled to the waveguide region and arranged to detect the optical signal via the weak evanescent coupling;
a first electrode and a second electrode coupled to the detector region, wherein the first electrode and the second electrode are configured to carry an output radiofrequency signal that is phase-matched with the optical signal; and
a dielectric layer interposed between the waveguide region and the detector region, wherein the dielectric layer is configured to provide the weak evanescent coupling.

2. The optoelectronic structure of claim 1, wherein the waveguide region is configured to carry an optical mode of the optical signal, and wherein the detector region is arranged such that only a portion of the optical mode is in contact with the detector region.

3. The optoelectronic structure of claim 1, wherein the waveguide region is a silicon-based waveguide region and/or the dielectric layer is a conformal silicon oxide-based film.

4. The optoelectronic structure of claim 1, wherein the waveguide region is configured to carry optical radiation having an average power that is greater than 5 mW, and wherein the detector region is configured for detection of the optical radiation without power saturation of the detector region.

5. The optoelectronic structure of claim 1, wherein the dielectric layer has a thickness of at least 1 cm.

6. The optoelectronic structure of claim 1, wherein the dielectric layer has a thickness corresponding to a wavelength of the radiofrequency signal.

7. The optoelectronic structure of claim 1, wherein the detector region includes a PN or a PIN junction that is arranged to receive, via the weak evanescent coupling, a portion of the optical energy of the optical signal.

8. The optoelectronic structure of claim 6, wherein the thickness of the dielectric layer corresponds to $1/10$ of the wavelength of the radiofrequency signal.

9. The optoelectronic structure of claim 7, wherein the junction is arranged to provide a detection current based on the optical signal.

10. The optoelectronic structure of claim 9, wherein the junction is coupled between the first electrode and the second electrode, and wherein the first electrode and the second electrode are each configured to carry one or more Transverse ElectroMagnetic (TEM) modes of electromagnetic radiation based on the detection current.

11. The optoelectronic structure of claim 7, wherein the junction is arranged to provide the detection current independent of an externally applied reverse bias.

12. The optoelectronic structure of claim 7, wherein the junction is arranged to provide a differential RF voltage across the junction.

13. An optoelectronic structure, comprising:
a waveguide region configured to guide an optical signal;
a detector region weakly evanescently coupled to the waveguide region and arranged to detect the optical signal via the weak evanescent coupling; and
a dielectric layer interposed between the waveguide region and the detector region,
wherein
the dielectric layer is configured to provide the weak evanescent coupling;
the detector region includes a PN or a PIN junction that is arranged to receive, via the weak evanescent coupling, a portion of the optical energy of the optical signal;
the junction is arranged to provide a detection current based on the optical signal;
the junction is coupled between a first electrode and the second electrode, and wherein the first electrode and the second electrode are each configured to carry one or more Transverse ElectroMagnetic (TEM) modes of electromagnetic radiation based on the detection current; and
the structure further comprises a dielectric region configured to provide phase velocity matching between an optical mode of the optical signal and the TEM modes.

14. The optoelectronic device of claim 13, further comprising one or more delay elements that are arranged for phase velocity matching between an optical mode of the optical signal and the TEM modes.

15. An optoelectronic device, comprising the optoelectronic structure of claim 1, wherein the optoelectronic device further includes:
a silicon waveguide comprising the waveguide region; and
a photodetector comprising the detector region.

16. The optoelectronic device of claim 15, wherein the photodetector and the waveguide are arranged in a traveling wave configuration.

17. An optoelectronic device, comprising:
a silicon waveguide having a waveguide region configured to guide an optical signal;
a photodetector having a detector region weakly evanescently coupled to the waveguide region and arranged to detect the optical signal via the weak evanescent coupling; and
a dielectric layer interposed between the waveguide region and the detector region;
wherein
the dielectric layer is configured to provide the weak evanescent coupling;
the waveguide has an axis arranged to guide the optical signal; and
the photodetector has an axis (1) aligned with the axis of the waveguide and (2) arranged to provide an RF signal such that the RF signal is phase matched with the optical signal.

* * * * *